(12) United States Patent
West

(10) Patent No.: US 8,295,049 B2
(45) Date of Patent: Oct. 23, 2012

(54) POWER CONVERTER WITH LINEAR DISTRIBUTION OF HEAT SOURCES

(75) Inventor: Richard Travis West, Ragged Point, CA (US)

(73) Assignee: Renewable Power Conversion, Inc., San Luis Obispo, CA (US)

( * ) Notice: Subject to any disclaimer, the term of this patent is extended or adjusted under 35 U.S.C. 154(b) by 0 days.

(21) Appl. No.: 13/117,796

(22) Filed: May 27, 2011

(65) Prior Publication Data

US 2012/0026770 A1     Feb. 2, 2012

(51) Int. Cl.
*H05K 7/20* (2006.01)

(52) U.S. Cl. ............ 361/715; 361/679.54; 361/690; 361/703; 361/704; 361/709; 361/718; 165/185; 136/206; 363/141

(58) Field of Classification Search ......... 361/679.54, 361/690, 703–704, 707, 709–710, 718; 165/185; 174/16.3, 520–521, 526, 547–548; 136/205–206, 136/246, 259; 454/184; 363/141
See application file for complete search history.

(56) References Cited

U.S. PATENT DOCUMENTS

| 5,031,023 | A | * | 7/1991 | Murari et al. | 257/707 |
| 6,625,024 | B2 | * | 9/2003 | Mermet-Guyennet | 361/700 |
| 7,113,405 | B2 | * | 9/2006 | Armstrong et al. | 361/719 |
| 7,505,274 | B2 | * | 3/2009 | Yu | 361/710 |
| 2004/0252455 | A1 | * | 12/2004 | Yi-Lung | 361/687 |
| 2009/0059546 | A1 | * | 3/2009 | Xing | 361/782 |
| 2010/0127371 | A1 | * | 5/2010 | Tschirbs | 257/684 |
| 2010/0134979 | A1 | * | 6/2010 | Obiraki et al. | 361/709 |

FOREIGN PATENT DOCUMENTS

JP    09023079 A  *  1/1997
RU    2367127 C2 *  9/2009

* cited by examiner

*Primary Examiner* — Robert J Hoffberg

(57) ABSTRACT

A power converter design is disclosed with a novel approach to thermal management which enhances the performance and significantly reduces the cost of the converter compared to prior art power converters. The invention minimizes the heating of one power component by another within the power converter and therefore enables the power converter to work at higher power levels. Essentially, the power converter uses a heatsink having a high length to width ratio, a linear array of power components thermally coupled to the heatsink parallel to the long axis of the heatsink and a heat removal system which produces the highest cross sectional thermal flux perpendicular to said long axis. In addition, a number of ancillary thermal management techniques are used to significantly enhance the value of this basic approach.

20 Claims, 4 Drawing Sheets

POWER CONVERTER WITH LINEAR DISTRIBUTION OF HEAT SOURCES

BACKGROUND OF THE INVENTION

Power converters for renewable energy power conversion, motor drives and uninterruptible power systems (UPS) all use three basic power component types; semiconductor devices, magnetic components and capacitors. All power components generate waste heat in the power conversion process.

Semiconductor devices generate heat due to conduction, switching and diode recovery losses. The waste heat must be transferred out of the device to limit the semiconductor die temperatures to safe maximums. Semiconductors are typically the primary source of power converter waste heat.

Magnetic components such as transformers and filter inductors have copper and core losses that generate heat, heat which must be removed to maintain the core properties and to protect the integrity of the electrical insulating materials.

Power capacitors used across a DC buss or as AC filters also generate heat from ripple currents acting against the internal impedance of a capacitor. Although the overall load on a power converter cooling system from capacitors is small compared to semiconductor and magnetic component losses, capacitors must operate at much lower temperatures to ensure their longevity.

The power rating of any power converter is a function of the power device ratings and the efficiency of the heat removal process. The usable lifetime of any power converter is directly related to the operating temperature of its component parts. These factors directly impact the cost, performance and reliability of any power converter.

BRIEF SUMMARY OF THE INVENTION

The invention is a power converter of any circuit topology that contains power semiconductor components, magnetic power components and capacitors where a novel means of thermal management is used to substantially improve performance, enhance reliability and reduce costs.

UTILITY OF THE INVENTION

The primary utility of the invention is in DC-to-AC power converters used in large solar photovoltaic power plants. Prior art central inverters for large solar power plants all use forced convection or liquid cooling methods requiring "moving" parts. These inverters typically have a usable lifetime of about fifteen years or half that of the connected solar photovoltaic modules. A power converter based on the natural convection cooled embodiment of the invention can achieve inverter/module lifetime parity. By using the disclosed linear distribution of heat sources, component operating temperatures can be kept much lower per unit cost of heatsink material. Sufficiently low operating temperatures extend component lifetimes and enable the use of internal solid potting materials in order to mitigate the effects of condensation, corrosion and particulate contamination. With low operating temperatures, no moving parts and environmental robustness, the natural convection cooled version of the invention is very cost effective at lower power levels and can provide the lowest installation and maintenance costs per unit energy produced over the 20-25 year lifetime of a solar photovoltaic power plant. It must be emphasized that the "low power" limitation does not preclude the use of the natural convection cooled solution in large, multi-megawatt power plants. The invention, in fact, supports and may enable a new paradigm for large power plant design where a large number of distributed DC-to-AC power converters can now be used more cost effectively than one large central inverter.

At higher power levels, where natural convection cooling would not be practical, the forced-convection-cooled embodiment of the invention provides significant cost benefits over other higher power, prior art converters. Although not as environmentally robust as a potted, natural convection cooled solution, increased reliability is supported by the requirement for less airflow per kilowatt of heat removal and therefore less particulate contamination of heatsink surfaces.

DETAILED DESCRIPTION OF THE INVENTION

A power converter design using discrete semiconductors and flat-form magnetic components will be described. This low power design is optimized for natural convection cooling. A high power design will next be described which uses semiconductor power modules and forced convection cooling. In both cases it will be demonstrated that with the invention, significant improvements can achieved in power converter performance and with a substantial reduction in power component costs.

Figure 1:
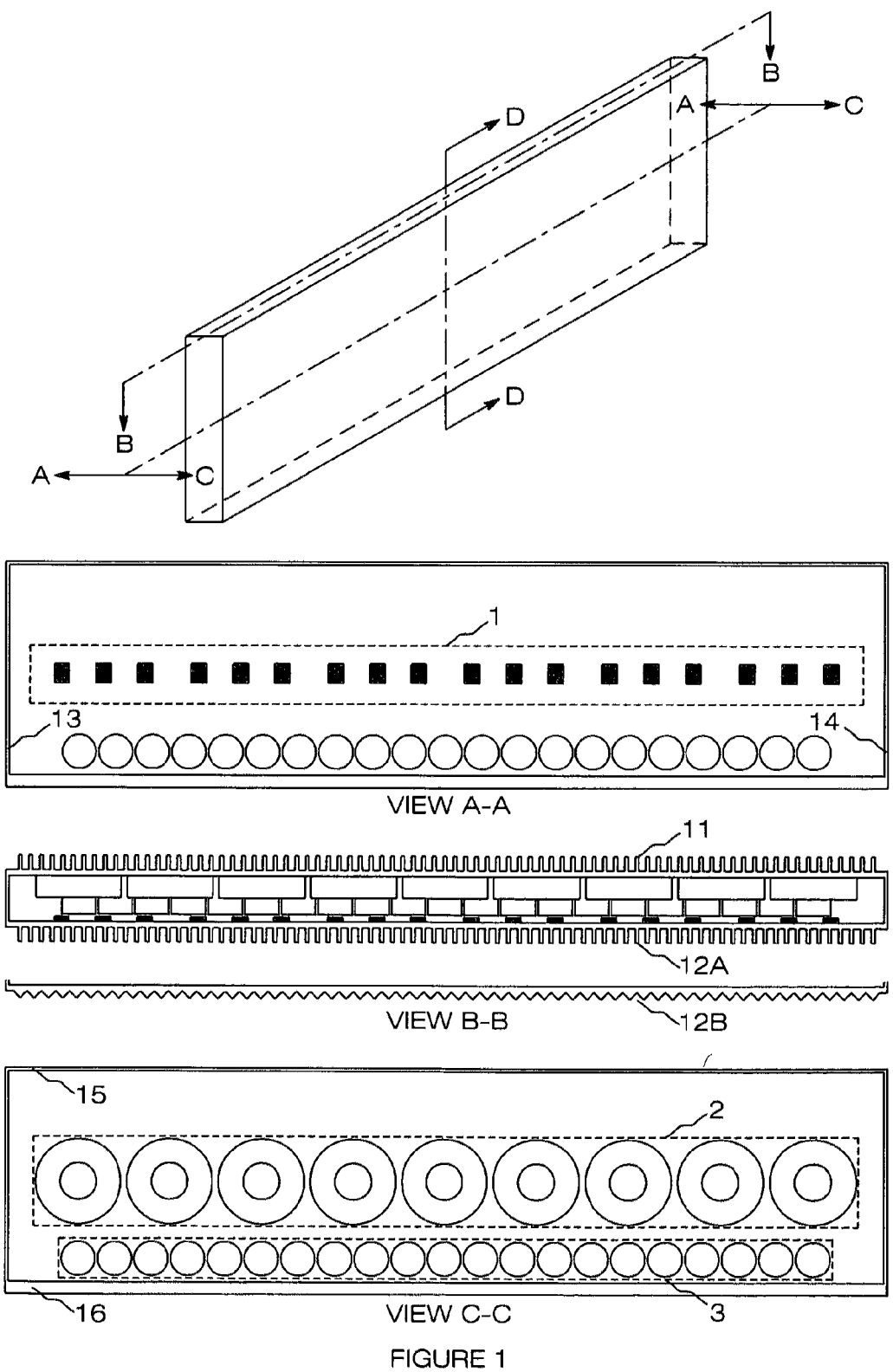
FIG. 1—A natural convection cooled power converter, based on the invention, is shown illustrating the basic arrangement of power components within the converter.

FIG. 1 illustrates the preferred embodiment of the invention as a DC to 3-phase AC power converter or inverter. The power converter is housed in a six sided enclosure comprising front panel 11, rear panel 12A or 12B, top panel 15, bottom panel 16, and side panels 13 and 14. All panels, or sides of the enclosure, act as heatsinks for internal electrical components to transfer heat to ambient air outside of the enclosure. The power converter illustrated is optimized for natural convection but may also be used with a shroud and cooling fan.

The isometric view in FIG. 1 provides the view port references A-A, B-B, C-C and D-D. The D-D section is used for associative reference with FIG. 2. In view A-A, a number of discrete semiconductor devices 1 are thermally bonded to rear panel 12A or 12B and are configured in a distributed linear array along the long axis of this panel. The device-to-device spacing varies based on the heat dissipation in each device. Semiconductor devices 1 are the primary heat producing elements in this design. The portion of the rear panel 12B exposed to ambient air has "fins" of a specific triangular cross section, which allows thermal energy to radiate in a direction normal to the fin surfaces without impinging on adjacent "fin" surfaces. In addition, this back panel geometry increases the panel surface area by 41% to decrease the thermal resistance from semiconductor 1 junctions to ambient air while minimizing boundary layer effects, compared to more restrictive rectangular fin geometries. All power converter panels could have this same exterior surface geometry to further reduce the overall temperature rise of the power converter. In view C-C, a number of toroid shaped inductors 2 (the magnetic components) are bonded to front panel 11 with thermally conductive epoxy or other means and are configured in a linear array along the long axis of this panel. Toroid inductors 2 are the second greatest heat producing elements in this design.

In both panels 11 and 12A or 12B, the direction of highest heat transfer is vertical in the direction of the natural convection air flow over the panel exteriors and in the path of least thermal resistance through the larger area cross section of each panel. There are essentially no semiconductor devices 1 or magnetic components 2 directly above or below any other component in the direction of the greatest heat flux, so that heating of one component by an adjacent component is minimized. Capacitors 3 generate a very small percentage of the power converter waste heat but must be kept a much lower operating temperatures than either semiconductor devices 1 or toroid inductors 2. In this design, capacitors 3 are thermally linked to bottom panel 16 and front panel 11. In this design and intended application, the bottom portion of the enclosure will have the lowest temperature rise above ambient, which insures the lowest operating temperature for capacitors 3.

Figure 2:
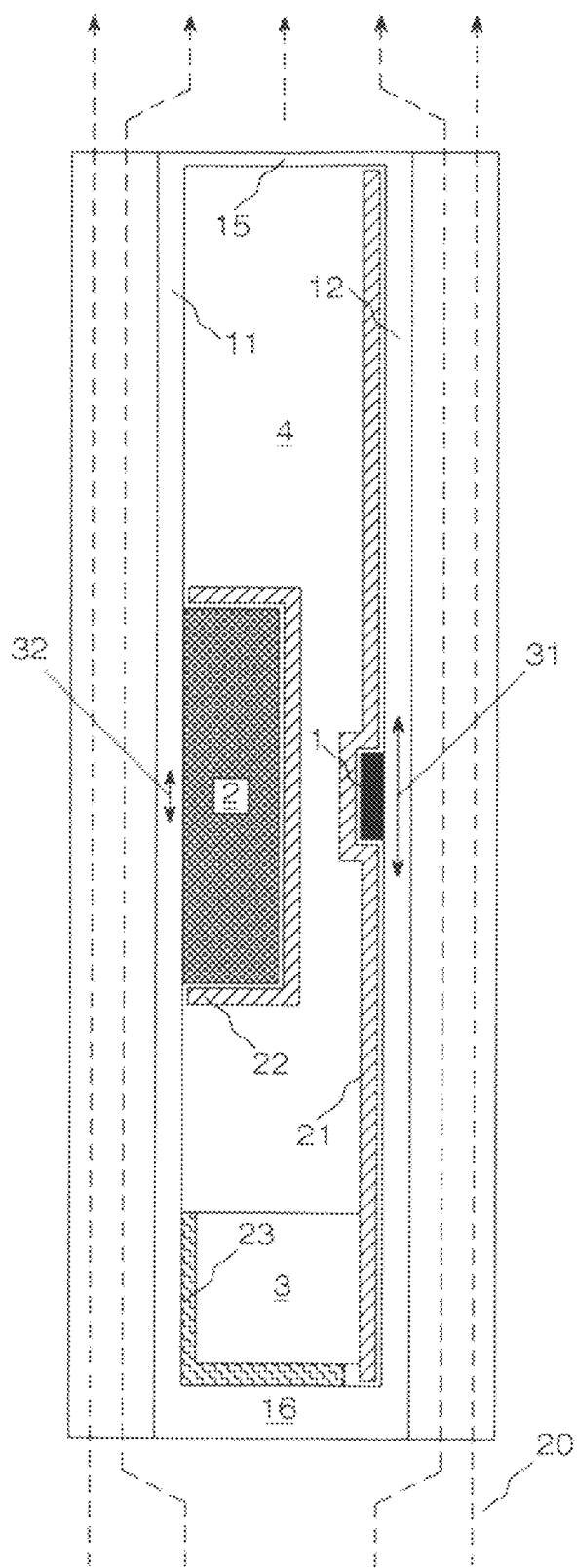
FIG. 2—A detailed cross sectional view of the natural convection cooled power converter shown in FIG. 1 is illustrated.

FIG. 2 illustrates the cross section of the power converter illustrated in FIG. 1 per section D-D. FIG. 2 is intended to facilitate a more in-depth discussion of the power converter illustrated in FIG. 1 and as such uses the same reference designators to provide associative reference. In FIG. 2, semiconductor devices 1 are thermally bonded to and electrically isolated from rear panel 12A or 12B. Thermally conductive adhesives or mechanical clamping, used in conjunction with electrically insulating, thermally conductive interface materials, may be used to bond and/or fasten semiconductor devices 1. For a given semiconductor device, the thermal resistances of junction-to-case, interface material and back panel-to-ambient air are additive. Insulated metal substrates may also be used to provide this desired function. In order to reject heat from semiconductor devices 1 to ambient air and not back into the enclosure, a thermally insulating material 21, such as adhesive backed closed cell foam, is bonded to the inside of enclosure back panel 12A or 12B. On the inside of front panel 11, flat-form toroidal inductors 2 are thermally bonded to the panel, with thermally conductive epoxy or by other means, in a linear array opposite the semiconductor linear array. A thermally insulating material 22 is used to cover the exposed interior surfaces of the magnetic components for the same purpose of restricting heat flow into the power converter enclosure. Capacitors 3 are mounded in the coolest, bottom part of the enclosure and are thermally coupled to bottom panel 16 and may also be thermally coupled to front panel 11 using conformable, heat conductive gap pads 23. While not shown in FIG. 1 or 2, there are pluralities of other components within the power converter, components which must be thermally managed. As such, the remaining power converter area 4, is filled with a thermally conductive material, such as a silicone-based potting gel. The gel provides (i) a thermal equalization and transfer media to non-thermally-insulated surfaces on front plate 11 and top plate 15, (ii) a robust moisture and dust seal, (iii) vibration and shock protection and (iv) dielectric component-to-component isolation. Arrows 31 and 32 indicate the direction of highest thermal flux in back panel 12A or 12B and front panel 11, respectively. Dotted arrows 20 illustrate the direction of natural convection air flow.

One application for the power converter described in the preceding sections is as a solar photovoltaic power converter for multi-megawatt solar photovoltaic power plants where a plurality low power distributed power converters are used. With the environmentally sealed, fanless, low-temperature-rise power converter herein disclosed, a power converter lifetime commensurate with that of solar module lifetimes can be realized.

Figure 3:
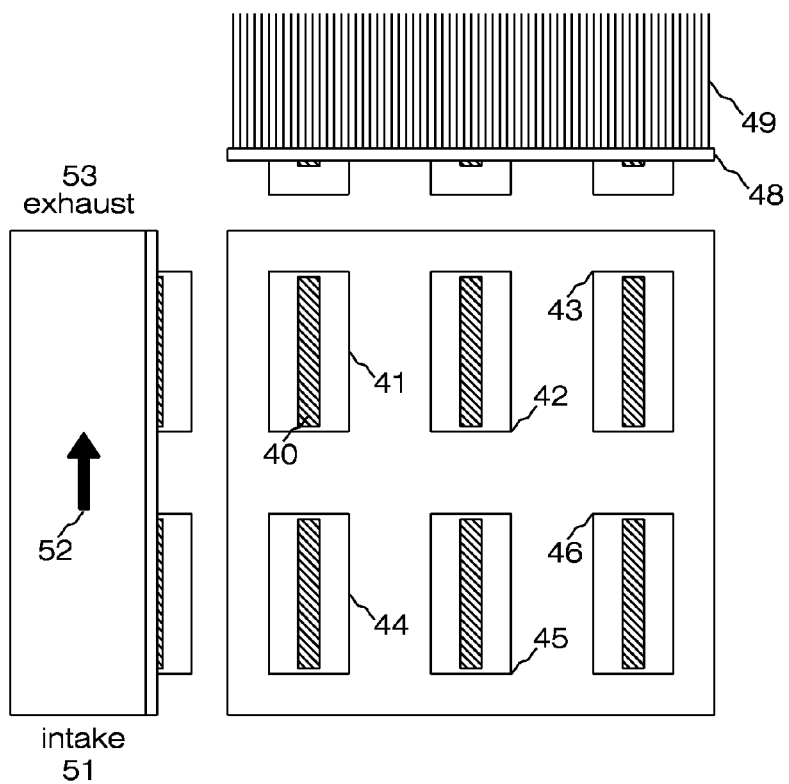
FIG. 3—A high power, prior art, force convection cooled power converter semiconductor module matrix and heatsink arrangement is illustrated.

FIGS. 1 and 2 illustrate a power converter designed primarily for lower power convection cooled applications. The invention may be applied with similar benefits in high power forced convection applications. FIG. 3 shows a prior art solution for a high power DC to 3-phase semiconductor switching matrix and heatsink assembly as is commonly used in motor drives, UPS systems and renewable energy power converters, employing six half-bridge power modules 41, 42, 43, 44, 45, 46 with two connected directly in parallel per AC phase. The power modules are thermally bonded to heatsink baseplate 48. Heat rejection to ambient air is accomplishes by forced convection through heatsink fins 49. Three views of the assembly are illustrated top, side and front (from top to bottom, right to left). The six power modules are mounted on a heatsink spaced apart in two dimensions to mitigate the heating of one module by adjacent modules. The heat generated in power modules 44, 45 and 46 will add to the temperature rise of power modules 41, 42, and 43 respectively and overall, all power modules will raise the temperatures of all others, bottom-to-top and side-to-side to a lesser degree. The basis of prior art forced convection cooling design is to approximate a constant heatsink base plate temperature by using a heatsink with a thick, heat-spreading base plate and a large fin surface area and by providing high air flow across fin 49 surfaces. The end goal is to keep all semiconductor junction temperatures equal so that current is shared equally by all parallel devices. Arrow 52 indicates the direction of air flow through the heatsink. Air entering the heatsink at intake port 51 will be cooler than the air leaving exhaust port 53 and heatsink baseplate 48 will always cooler near intake port 51 compared to exhaust port 53. In very general terms, and with other variables held constant, the longer the heatsink, from intake to exhaust, the higher the temperature difference from end to end. In practice, a shroud or some plenum structure, not shown, will be used to (only) direct cooling air through the areas between the fins. The cross hatched sections in FIG. 3, as indicated by reference designator 40, shows a linear arrangement of multiple semiconductor die within the power modules. The problem of cooling a square or rectangular module matrix is compounded by the linear arrangement semiconductor dies within the modules because the bottom dies will, to some extent, heat the top dies.

Figure 4:
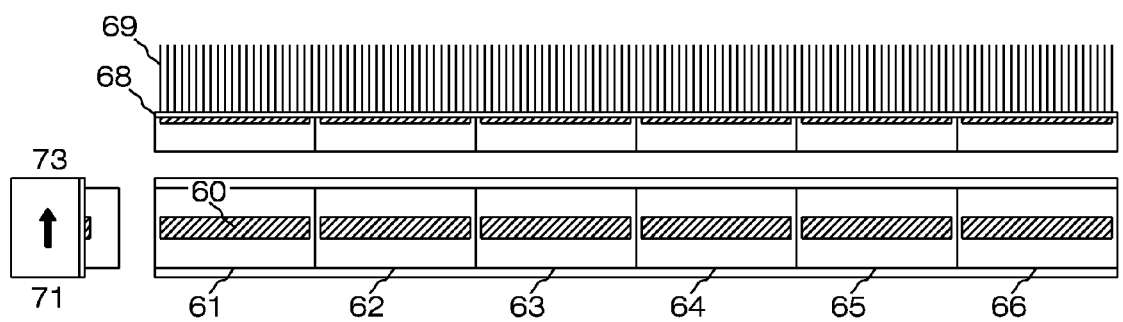
FIG. 4—A high power, forced convection cooled power converter semiconductor module matrix and heatsink arrangement, based on the invention, is illustrated.

FIG. 4 illustrates an improved method and a second embodiment of the invention where power modules 61, 62, 63, 64, 65 and 66 are used instead of discrete devices used in the preferred embodiment. In FIG. 4, the same power modules used in the FIG. 3 prior art solution are arranged end-to-end as are the internal linear semiconductor die arrays 60. In this design the semiconductor die 60 temperatures can be kept equal with a thinner baseplate 68, less fin 69 area, and a much shorter heatsink length intake port 71 to exhaust port 73. As a result, the back pressure for the forced convection fans is reduced as is the air velocity requirement. If less cooling air is required the amount of heatsink particulate contamination and surface corrosion is reduced. The prior art method in contrast can be considered brute force by comparison. In addition, there is a law of diminishing returns for any such cooling system where a larger heatsink and higher air flow rates offer little percentage improvement and may work against the end goal. For example, as the heatsink base plate thickness is increased to provide better lateral heat spreading, the thermal resistance from the semiconductor dies to the fins (normal to the module attachment surface) is increased.

For clarity, FIGS. 3 and 4 are used only to illustrate the key premise of the invention; the benefit of using a linear distribution of heat sources arranged perpendicular to the flow of cooling air. In practice, the module and heatsink arrangement shown in FIG. 4 would be connected to a laminated buss assembly containing a number of DC energy storage "power" capacitors. The magnetic components, typically line filter reactors to used integrate the high frequency pulse modulated signals from the semiconductor switching matrix can, in this forced convection design, be decoupled from the semiconductor module and heatsink assembly and mounted in the bottom of the power converter cabinet to insure the weight distribution stability of the power converter cabinet. The common theme in both embodiments is the relative placement of the three primary heat producing power components, semiconductors, magnetics and capacitors. In the forced convection embodiment, outside ambient cooling air flows over the capacitors first, before being preheated by any other heat sources, then through the semiconductor module matrix heatsink fins and then over the magnetic components. The intent is to progressively cool the most heat sensitive components, the capacitors, first and the least heat sensitive components, the magnetics, last as the cooling air is progressively raised from ambient temperature to the power converter exhaust temperature. Power capacitors in large prior art power converters are typically not in the ambient air cooling path. Any number of plenum and directional air ducting methods can be used to achieve this function. The exact details on how these ancillary functions are implemented for use with the primary semiconductor and heatsink arrangement shown in FIG. 4 are beyond the scope of this invention and disclosure.

Figure 5:
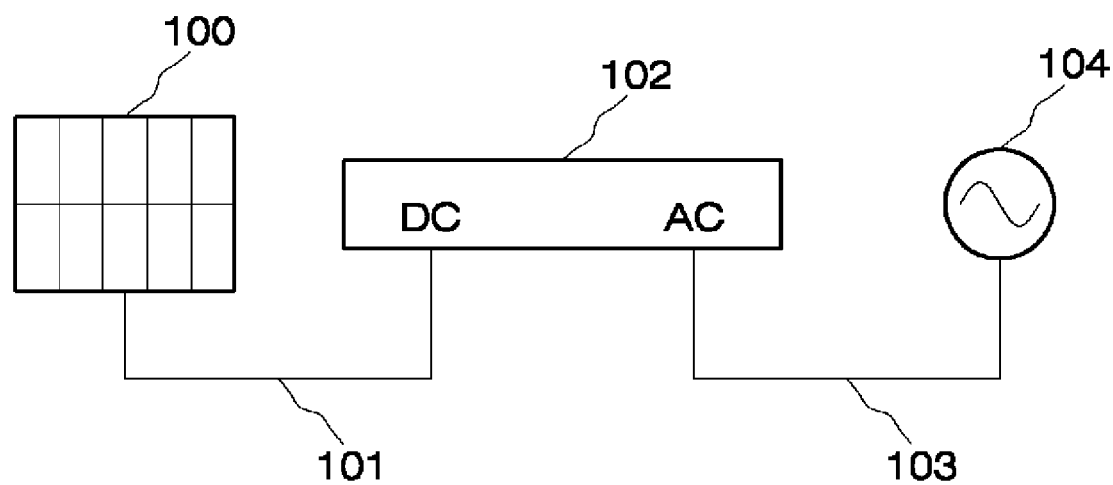
FIG. 5—The invention is shown in a typical application as a photovoltaic DC-to-AC power converter.

FIG. 5 shows the invention in one preferred application as a photovoltaic DC-to-AC power converter. Solar photovoltaic power source 100 is coupled to power converter 102 with DC conductors 101 and to load 104 with AC conductors 103. Power converter 102 converts DC power from solar photovoltaic power source 100 to AC power to supply load 104.

What I claim as my invention is:

1. An apparatus for converting solar power comprising a solar photovoltaic source and a power converter coupled to the solar photovoltaic source, the power converter comprising:
   an enclosure, the enclosure including at least one heat sink;
   a plurality of semiconductor devices mounted on an inner side of the enclosure;
   a plurality of magnetic components mounted within the enclosure;
   a plurality of capacitors mounted within the enclosure;
   a means for thermally and mechanically coupling said plurality of semiconductor devices to said at least one heatsink;
   a means for thermally coupling said plurality of magnetic components to said at least one heatsink;
   a means for providing thermal isolation between said plurality of capacitors and at least one of said plurality of semiconductor devices or said plurality of magnetic components,
   wherein said plurality of semiconductor devices are arranged on said at least one heatsink in a substantially linear horizontal array,
   wherein at least one of:
      a vertical height of said at least one heatsink on which said plurality of semiconductor devices are arranged is less than a horizontal length of said at least one heatsink on which said plurality of semiconductor devices are arranged, or
      a path of thermal resistance in a vertical direction of said at least one heatsink on which said plurality of semiconductor devices are arranged is less than a path of thermal resistance in a horizontal direction of said at least one heatsink on which said plurality of semiconductor devices are arranged, and
   wherein said enclosure provides environmental protection for said plurality of semiconductor devices, said plurality of magnetic components and said plurality of capacitors.

2. The apparatus for converting solar power according to claim 1, the power converter further comprising an encapsulant, an adhesive or a potting material inside of the enclosure that provides at least one of electrical dielectric isolation, thermal conductivity, thermal insulation, or an environmental seal.

3. The apparatus for converting solar power according to claim 1, wherein said plurality of magnetic components are arranged on said at least one heatsink in a substantially linear horizontal array.

4. The apparatus for converting solar power according to claim 3, wherein said means for providing the thermal isolation between said plurality of capacitors and said at least one of said plurality of semiconductor devices or said plurality of magnetic components is a location of said plurality of capacitors below each of said plurality of semiconductors and said plurality of magnetic components.

5. The apparatus for converting solar power according to claim 1, wherein said means for providing the thermal isolation between said plurality of capacitors and said at least one of said plurality of semiconductor devices or said plurality of magnetic components is a location of said plurality of capacitors below each of said plurality of semiconductors and said plurality of magnetic components.

6. The apparatus for converting solar power according to claim 1, wherein said means for providing the thermal isolation between said plurality of capacitors and said at least one of said plurality of semiconductor devices or said plurality of magnetic components is a thermally insulating material inside of said enclosure located between said plurality of capacitors and at least one of a portion of said heatsink, said plurality of semiconductor devices or said plurality of magnetic components.

7. The apparatus for converting solar power according to claim 1, wherein said at least one heatsink on which said plurality of semiconductor devices are arranged includes a plurality of vertically extending fins, and wherein said plurality of vertically extending fins are located on an outer side of said enclosure.

8. The apparatus for converting solar power according to claim 7, wherein each of said plurality of vertically extending fins has a triangular cross section.

9. The apparatus for converting solar power according to claim 7, the power converter further comprising an encapsulant, an adhesive or a potting material inside of the enclosure that provides at least one of electrical dielectric isolation, thermal conductivity, thermal insulation, or an environmental seal.

10. The apparatus for converting solar power according to claim 7, wherein said plurality of magnetic components are arranged on said at least one heatsink in a substantially linear horizontal array.

11. The apparatus for converting solar power according to claim 10, wherein said means for providing the thermal isolation between said plurality of capacitors and said at least one of said plurality of semiconductor devices or said plurality of magnetic components is a location of said plurality of capacitors below each of said plurality of semiconductors and said plurality of magnetic components.

12. The apparatus for converting solar power according to claim 7, wherein said means for providing the thermal isolation between said plurality of capacitors and said at least one of said plurality of semiconductor devices or said plurality of magnetic components is a location of said plurality of capacitors below each of said plurality of semiconductors and said plurality of magnetic components.

13. The apparatus for converting solar power according to claim 7, wherein said means for providing the thermal isolation between said plurality of capacitors and said at least one of said plurality of semiconductor devices or said plurality of magnetic components is a thermally insulating material inside of said enclosure located between said plurality of capacitors and said plurality of capacitors and at least one of a portion of said heatsink, said plurality of semiconductor devices or said plurality of magnetic components.

14. An apparatus for converting solar power comprising a solar photovoltaic source and a power converter coupled to the solar photovoltaic source, the power converter comprising:
   an enclosure, the enclosure including at least one heat sink;
   a plurality of semiconductor devices mounted on an inner side of the enclosure;
   a plurality of magnetic components mounted within the enclosure;
   a plurality of capacitors mounted within of the enclosure;
   a means for thermally and mechanically coupling said plurality of semiconductor devices to said at least one heatsink;
   a means for thermally coupling said plurality of magnetic components to said at least one heatsink; and
   a means for providing thermal isolation between said plurality of capacitors and at least one of said plurality of semiconductor devices or said plurality of magnetic components,
   wherein said plurality of semiconductor devices are arranged on said at least one heatsink in a substantially linear horizontal array,
   wherein said at least one heatsink includes a plurality of vertically extending fins, the plurality of vertically extending fins are located on an outer side of said enclosure, and
   wherein said enclosure provides environmental protection for said plurality of semiconductor devices, said plurality of magnetic components and said plurality of capacitors.

15. The apparatus for converting solar power according to claim 14, the power converter further comprising an encapsulant, an adhesive or a potting material inside of the enclosure that provides at least one of electrical dielectric isolation, thermal conductivity, thermal insulation, or an environmental seal.

16. The apparatus for converting solar power according to claim 14, wherein said plurality of magnetic components are arranged on said second one of said at least one heatsink in a substantially linear horizontal array.

17. The apparatus for converting solar power according to claim 16, wherein said means for providing the thermal isolation between said plurality of capacitors and said at least one of said plurality of semiconductor devices or said plurality of magnetic components is a location of said plurality of capacitors below each of said plurality of semiconductors and said plurality of magnetic components.

18. The apparatus for converting solar power according to claim 14, wherein said means for providing the thermal isolation between said plurality of capacitors and said at least one of said plurality of semiconductor devices or said plurality of magnetic components is a location of said plurality of capacitors below each of said plurality of semiconductors and said plurality of magnetic components.

19. The apparatus for converting solar power according to claim 14, wherein said means for providing the thermal isolation between said plurality of capacitors and said at least one of said plurality of semiconductor devices or said plurality of magnetic components is a thermally insulating material inside of said enclosure located between said plurality of capacitors and at least one of a portion of said heatsink, said plurality of semiconductor devices or said plurality of magnetic components.

20. The apparatus for converting solar power according to claim 14, wherein each of said plurality of vertically extending fins has a triangular cross section.

* * * * *